US009725298B2

(12) United States Patent
Feyh et al.

(10) Patent No.: US 9,725,298 B2
(45) Date of Patent: *Aug. 8, 2017

(54) CMOS INTEGRATED MOVING-GATE TRANSDUCER WITH SILICON AS A FUNCTIONAL LAYER

(71) Applicant: Robert Bosch GmbH, Stuttgart (DE)

(72) Inventors: Ando Feyh, Reutlingen (DE); Po-Jui Chen, Cupertino, CA (US); Markus Ulm, Wannweil (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/988,842

(22) Filed: Jan. 6, 2016

(65) Prior Publication Data
US 2016/0115013 A1    Apr. 28, 2016

Related U.S. Application Data

(63) Continuation of application No. 14/108,901, filed on Dec. 17, 2013, now Pat. No. 9,255,000.

(60) Provisional application No. 61/745,569, filed on Dec. 22, 2012.

(51) Int. Cl.
*H01L 29/84* (2006.01)
*H01L 21/50* (2006.01)
(Continued)

(52) U.S. Cl.
CPC ........ *B81B 3/0021* (2013.01); *B81C 1/00134* (2013.01); *B81C 1/00246* (2013.01);
(Continued)

(58) Field of Classification Search
CPC .......... B81B 2201/0235; B81B 3/0021; B81B 3/0005; B81B 3/0018; B81B 2201/0221;
(Continued)

(56) References Cited

U.S. PATENT DOCUMENTS 5,103,279 A    4/1992  Gutteridge
8,587,077 B2*  11/2013 Chen ................... B81C 1/00238
                                                257/254
(Continued)

FOREIGN PATENT DOCUMENTS

WO    2010138717 A1    12/2010

OTHER PUBLICATIONS

Aoyagi et al., Accelerometer Using MOSFET with Movable Gate Electrode: Electroplating Thick Nickel Proof Mass on Flexible Parylene Beam for Enhancing Sensitivity, Transducers' 11, Jun. 5-9, 2011, pp. 2030-2033, Beijing, China.
(Continued)

*Primary Examiner* — Marcos D Pizarro Crespo
*Assistant Examiner* — Nelson Garces
(74) *Attorney, Agent, or Firm* — Maginot, Moore & Beck LLP

(57) ABSTRACT

A method of fabricating a semiconductor device comprises forming a dielectric layer above a substrate, the dielectric layer including a fixed dielectric portion and a proof mass portion, forming a source region and a drain region in the substrate, forming a gate electrode in the proof mass portion, and releasing the proof mass portion, such that the proof mass portion is movable with respect to the fixed dielectric portion and the gate electrode is movable with the proof mass portion relative to the source region and the drain region.

19 Claims, 9 Drawing Sheets

(51) Int. Cl.
*B81C 1/00* (2006.01)
*B81B 3/00* (2006.01)
*B81B 7/00* (2006.01)
*H01L 29/772* (2006.01)
*H01L 21/02* (2006.01)
*H01L 21/58* (2006.01)

(52) U.S. Cl.
CPC ............... *B81B 2201/0221* (2013.01); *B81B 2201/0228* (2013.01); *B81C 2203/0771* (2013.01)

(58) Field of Classification Search
CPC ........ B81B 2203/0181; B81B 2203/06; B81B 3/001; B81B 3/0075; B81B 7/007; B81B 2201/0264; B81B 2203/033; B81B 2207/015; B81B 3/0086; B81B 7/0064; B81B 7/0077; B81B 7/02
USPC .................................................. 257/250–260
See application file for complete search history.

(56) References Cited

U.S. PATENT DOCUMENTS

| | | | |
|---|---|---|---|
| 8,866,238 B2* | 10/2014 | Classen | B81C 1/00246 257/226 |
| 9,255,000 B2* | 2/2016 | Feyh | B81C 1/00246 |
| 2007/0193355 A1 | 8/2007 | Axelrod et al. | |
| 2011/0050201 A1* | 3/2011 | Bhat | B81C 1/00246 324/71.5 |
| 2012/0049299 A1* | 3/2012 | Chou | B81C 1/00246 257/417 |
| 2012/0189143 A1* | 7/2012 | Buhmann | H04R 19/005 381/174 |
| 2012/0199920 A1* | 8/2012 | Zhang | B81B 7/0077 257/415 |

OTHER PUBLICATIONS

Kniffin et al., Modeling and Characterization of an Integrated FET Accelerometer, Motorola, 1998, pp. 546-551, Los Alamos, NM, USA.

* cited by examiner

CMOS INTEGRATED MOVING-GATE TRANSDUCER WITH SILICON AS A FUNCTIONAL LAYER

This application is a continuation of co-pending application Ser. No. 14/108,901, filed on Dec. 17, 2013, which in turn claims the benefit of U.S. Provisional Application No. 61/745,569, filed on Dec. 22, 2012. The disclosures of the two above-identified patent applications are hereby totally incorporated by reference in their entirety.

FIELD

This disclosure relates generally to semiconductor devices and particularly to a microelectromechanical system (MEMS) having a moving-gate transducer.

BACKGROUND

Microelectromechanial (MEMS) inertial sensors are electrical transducers that convert a change in an external measurand into a change in an electrical signal. MEMS inertial sensors are configurable to function as accelerometers, gyroscopes, pressure sensors, and Lorenz-force magnetometers, among other types of sensors.

Typically, MEMS inertial sensors sense the external measurand using the capacitive transduction principle. A device using the capacitive transduction principle exhibits a change in capacitance in response to a change in the external measurand. For example, a MEMS inertial sensor may include a first member that is movable relative to a second member in response to a change in acceleration of the sensor. As the first member moves relative to the second member, a change in capacitance is exhibited between the two members that represents the change in acceleration of the sensor.

There is a desire to implement MEMS inertial sensors that use other types of transduction principles in order to sense the external measurand. These other transduction principles, such as the moving-gate transduction principle, however, have been difficult to implement within the complementary metal oxide semiconductor (CMOS) flow of chip development.

Therefore, further developments in the area of MEMS inertial sensors are desirable.

SUMMARY

According to an exemplary embodiment of the disclosure, a method of fabricating a semiconductor device comprises forming a dielectric layer above a substrate, the dielectric layer including a fixed dielectric portion and a proof mass portion, forming a source region and a drain region in the substrate, forming a gate electrode in the proof mass portion, and releasing the proof mass portion, such that the proof mass portion is movable with respect to the fixed dielectric portion and the gate electrode is movable with the proof mass portion relative to the source region and the drain region.

According to another exemplary embodiment of the disclosure, a semiconductor device comprises a source region and a drain region defined in a substrate, a dielectric layer supported by the substrate, the dielectric layer including a fixed dielectric portion and a proof mass portion, a gate electrode defined in the proof mass portion, the gate electrode movable with the proof mass portion relative to the source region and the drain region.

According to yet another exemplary embodiment of the disclosure, a semiconductor device includes a substrate, a dielectric layer located above the substrate, a proof mass including a first portion of the dielectric layer, the proof mass movable within a proof mass space, and a moving-gate transducer at least partially formed within the substrate and at least partially formed within the proof mass.

BRIEF DESCRIPTION OF THE FIGURES

The above-described features and advantages, as well as others, should become more readily apparent to those of ordinary skill in the art by reference to the following detailed description and the accompanying figures in which.

DETAILED DESCRIPTION

Figure 1:
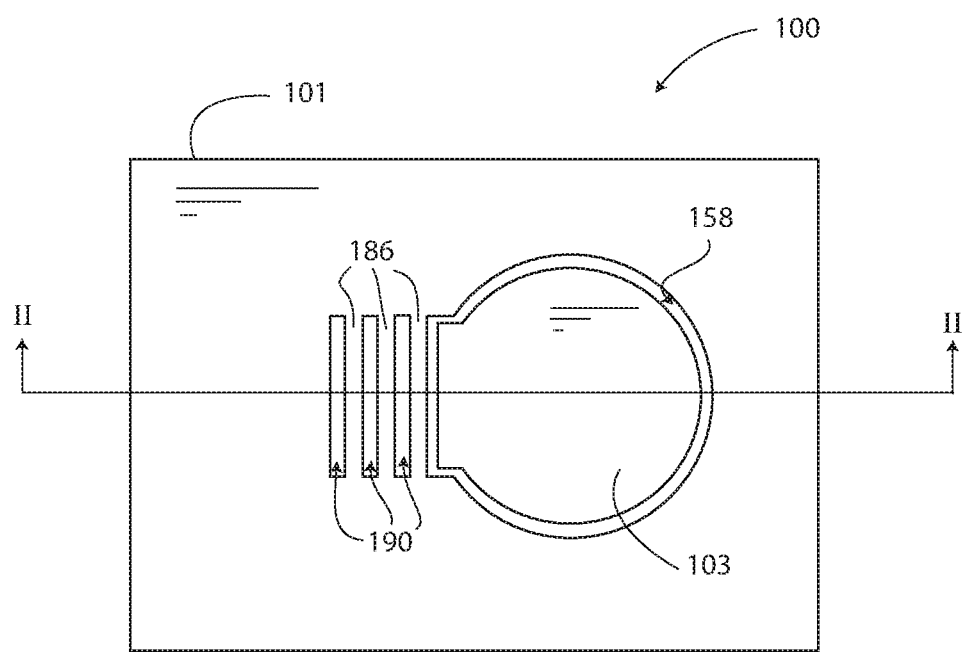
FIG. 1 is a top plan view of a MEMS semiconductor device, as described herein, configured to sense an external measurand using the moving-gate transduction principle, the MEMS semiconductor device includes CMOS circuitry.

For the purpose of promoting an understanding of the principles of the disclosure, reference will now be made to the embodiments illustrated in the drawings and described in the following written specification. It is understood that no limitation to the scope of the disclosure is thereby intended. It is further understood that this disclosure includes any alterations and modifications to the illustrated embodiments and includes further applications of the principles of the disclosure as would normally occur to one skilled in the art to which this disclosure pertains.

As shown in FIG. 1, an exemplary MEMS semiconductor device 100 includes a fixed portion 101 and a proof mass 103. As described herein, the proof mass 103 is configured to move relative to the fixed portion 101 in response to a changing acceleration of the semiconductor device 100.

Figure 2:
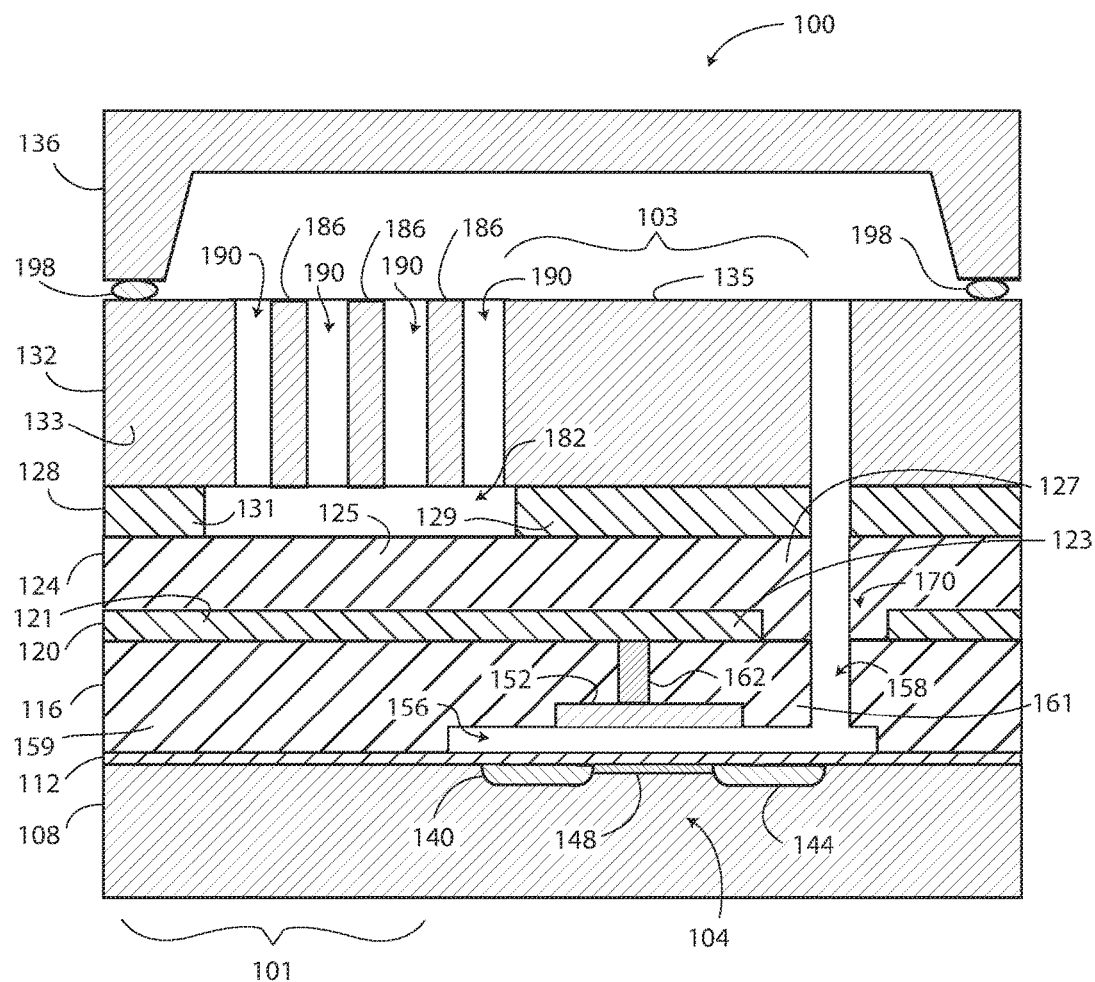
FIG. 2 is a side cross sectional view taken along a line similar to the line II-II of FIG. 1, showing the MEMS semiconductor device of FIG. 1 including a cap positioned on an upper surface thereof.

With reference to the cross sectional view of FIG. 2, the semiconductor device 100 further includes a CMOS integrated moving-gate transducer 104, a substrate 108, an oxide layer 112, a lower dielectric layer 116, a routing layer 120, an upper dielectric layer 124, a bond layer 128, a bonded silicon layer 132, and a cap 136 (the cap 136 is not shown in FIG. 1 in order to illustrate the proof mass 103).

The transducer 104 includes a left doped region 140, a right doped region 144, a channel region 148, and a gate electrode 152. In an exemplary embodiment, the transducer 104 is an n-channel enhancement-type metal oxide semiconductor field effect transistor ("MOSFET"). Accordingly, in the exemplary embodiment the doped regions 140, 144 are n-type regions formed in the p-type substrate 108. The left doped region 140 is connected to an external circuit (not shown) and is configured to function as a source connection (or a drain connection) of the transducer 104. The right doped region 144 is connected to the external circuit and is configured to function as a drain connection (or a source connection, if the left doped region 140 is functioning as a drain connection) of the transducer 104. In another embodiment, the transducer 104 is any other type of field effect transistor having any type of doping.

The channel region 148 is a portion of the substrate 108 located between the doped regions 140, 144. In response to voltage applied to the gate electrode 152, a conducting path is induced in the channel region 148, which enables a current flow between the doped regions 140, 144.

The gate electrode 152 is spaced apart from the left doped region 140, the right doped region 144, and the channel region 148 by the oxide layer 112 and a gap 156. The gate electrode 152 is conductive since it is formed from polysilicon. In another embodiment, the gate electrode 152 is formed from metal or any other suitable material. The gate electrode 152 is formed in the lower dielectric layer 116; accordingly, in one embodiment, the transducer 104 is at least partially formed in the substrate 108 and at least partially within the lower dielectric layer 116.

The oxide layer 112 is formed above the substrate 108 and is located between the gate electrode 152 and the doped regions 140, 144, and the channel region 148. The oxide layer 112 partially defines the gap 156. The oxide layer 112 is formed from silicon dioxide. In another embodiment, the oxide layer 112 is formed from another type of suitable material.

The lower dielectric layer 116 (a first dielectric layer) is formed on the oxide layer 112 and is supported by the substrate 108. The lower dielectric layer 116 partially defines the gap 156 and partially defines a trench 158. The lower dielectric layer 116 includes a fixed dielectric portion 159 and a proof mass portion 161. The fixed portion 101 includes the fixed dielectric portion 159, and the proof mass 103 includes the proof mass portion 161. The gate electrode 152 is included in the proof mass portion 161, and, as such, is also included in the proof mass 103. The lower dielectric layer 116 is formed from silicon oxide or another suitable material.

The routing layer 120 is formed on the lower dielectric layer 116 and defines a passage 170. A portion of the upper dielectric layer 124 partially occludes the passage 170. The routing layer 120 includes a fixed routing portion 121 and a proof mass portion 123. The fixed portion 101 includes the fixed routing portion 121, and the proof mass 103 includes the proof mass portion 123. The routing layer 120 is formed from a material that is typically used as a mask during CMOS chip development. In one embodiment, the routing layer 120 is formed from metal. An electrically conductive path 162 electrically connects the gate electrode 152 to the routing layer 120.

The upper dielectric layer 124 (a second dielectric layer) is formed above the lower dielectric layer 116. The upper dielectric layer 124 partially defines the trench 158. The upper dielectric layer 124 includes a fixed dielectric portion 125 and a proof mass portion 127. The fixed portion 101 includes the fixed dielectric portion 125, and the proof mass 103 includes the proof mass portion 127. The upper dielectric layer 124 is formed from silicon oxide or another suitable dielectric material.

The bond layer 128 is formed above the upper dielectric layer 124. The bond layer 128 defines a space 182 and partially defines the trench 158. The space 182 is spaced apart from the trench 158. The bond layer 128 is formed from a material that is typically used as a mask during CMOS chip development. In one embodiment, the bond layer 128 is formed from metal, preferably aluminum, in another embodiment the bond layer is formed from a suitable oxide. The proof mass 103 includes a proof mass portion 129 of the bond layer 128. A fixed bond portion 131 of the bond layer 128 is included in the fixed portion 101.

The silicon layer 132 is formed above the bond layer 128. The silicon layer 132 is a silicon wafer (bulk or silicon on insulator ("SOI")), which is bonded to the bond layer 128 according to any desired process. The silicon layer 132 includes a fixed silicon portion 133 (a first silicon portion) and a proof mass portion 135 (a second silicon portion). The fixed portion 101 includes the fixed silicon portion 133, and the proof mass 103 includes the proof mass portion 135.

As shown in FIGS. 1 and 2, the silicon layer 132 includes micromechanical structures 186, which define vent passages 190. The silicon layer 132 also partially defines the trench 158. The proof mass portion 135 is spaced apart from the fixed portion 133 by at least one of the passages 190 and the trench 158. In another embodiment, the passages 190 have different widths. As shown in FIG. 1, the vent passages 190 are generally rectangular; however, in another embodiment, the vent passages are substantially circular or any other desired shape.

With reference again to FIG. 2, the silicon cap 136 is bonded to the silicon layer 132 with a bonding member 198. The cap 136 covers and protects the transducer 104. The silicon cap 136 is spaced apart from the proof mass 103. When the cap 136 is connected to the silicon layer 132, the gap 156 and the trench 158 are isolated from the atmosphere surrounding the semiconductor sensor device 100. In another embodiment, the cap 136 is formed from a material other than silicon.

As described above, the semiconductor device 100 includes a proof mass 103 and a fixed portion 101, which may also be referred to herein as an anchored portion. The proof mass 103 is spaced apart from the oxide layer 112 by the gap 156. The proof mass 103 includes the proof mass portions 123, 127, 129, 135, 161. The fixed portion 101 includes the portion of the sensor portion that is spaced apart from the proof mass 103, including the micromechanical structures 186 the fixed silicon portion 133, the fixed bond portion 131, the fixed dielectric portion 125, the fixed routing portion 121, the fixed dielectric portion 159, the oxide layer 112, and the substrate 108. Accordingly, the doped region 140, the doped region 144, and the channel region 148 are located in the fixed portion 101, and the gate electrode 152 is located in the proof mass 103.

Figure 3:
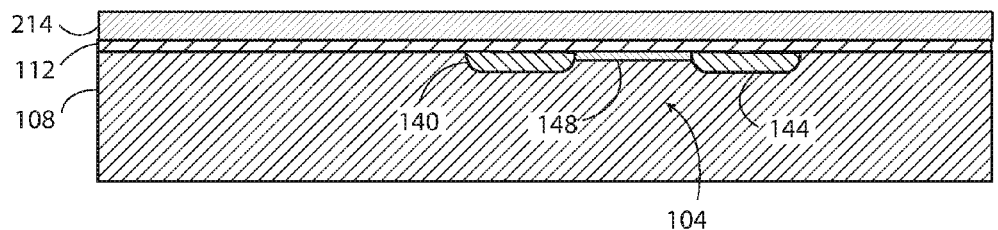
FIG. 3 is a side cross sectional view taken along a line similar to the line II-II of FIG. 1, showing a substrate, an oxide layer, and a first sacrificial layer.

With reference to FIG. 3, the semiconductor device 100 is fabricated, in one embodiment, according to the following exemplary method. The process begins with providing the substrate 108. Then, the left doped region 140 and the right doped region 144 are formed in the substrate 108 by way of diffusion, ion implementation, or any other process typically used to dope a semiconductor.

Next, the oxide layer 112 is formed above the substrate 108. Typically, a chemical vapor deposition process is used to form the oxide layer 112; however, any method may be used to form the oxide layer.

Figure 4:
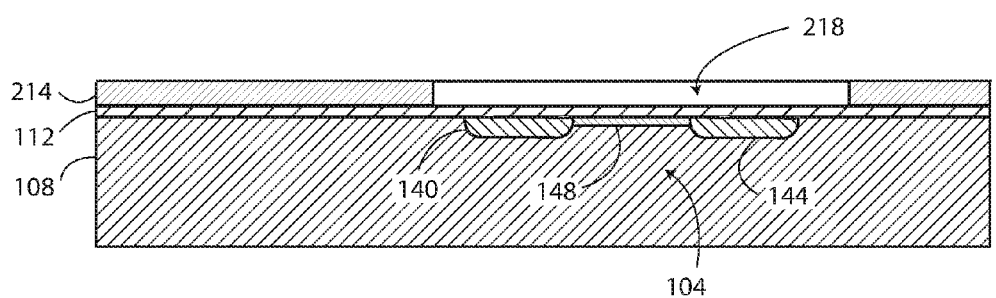
FIG. 4 is a side cross sectional view taken along a line similar to the line II-II of FIG. 1, showing an opening etched into the first sacrificial layer.

Subsequently, as shown in FIG. 4, a sacrificial layer 214 is formed on the oxide layer 112. A portion of the sacrificial layer 214 is etched by a dry etch process to form an opening 218 having an area approximately equal to the area of the gap 156. In another embodiment, a mask (not shown) is applied to the sacrificial layer 214 and the opening 218 is formed by trenching through the sacrificial layer 214 using the mask as a guide.

Figure 5:
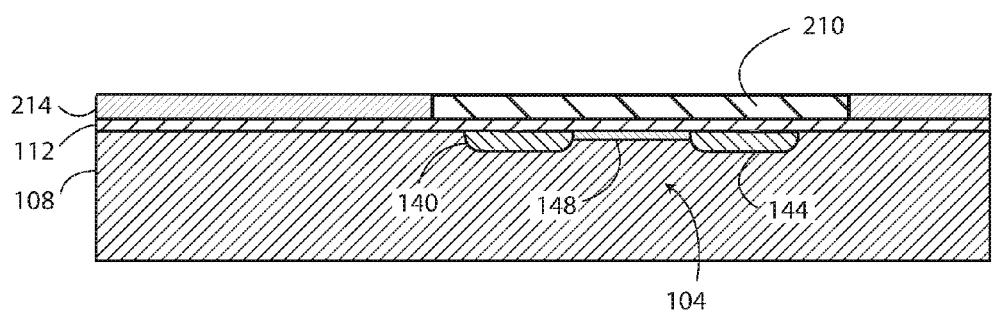
FIG. 5 is a side cross sectional view taken along a line similar to the line II-II of FIG. 1, showing a second sacrificial layer deposited into the opening etched into the first sacrificial layer.

Then, as shown in FIG. 5, a sacrificial layer 210 is formed in the opening 218 of the sacrificial layer 214 above the substrate 108. The sacrificial layer 210 consists of known materials with known release processes, which are compatible with a CMOS manufacture process flow. Exemplary materials for forming the sacrificial layer 210 include polysilicon, SiGe, or a metallic layer. Next, the sacrificial layers 210, 214 are smoothed. Any process may be used to smooth the sacrificial layers 210, 214 including chemical and mechanical polishing (CMP). After the smoothing, the sacrificial layer 214 is removed leaving behind the sacrificial layer 210 on the oxide layer 112.

Figure 6:
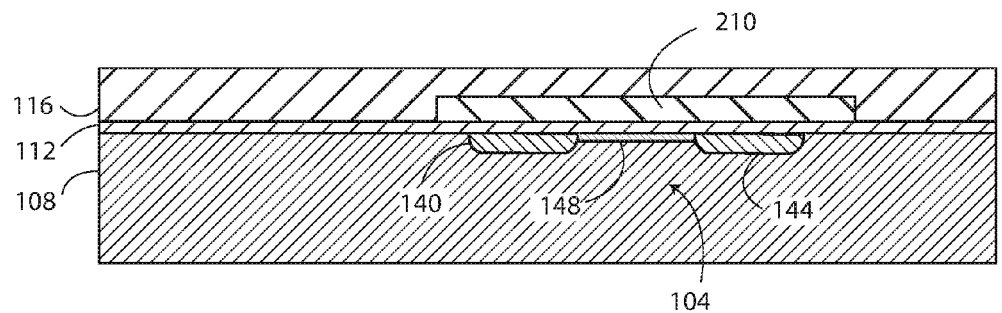
FIG. 6 is a side cross sectional view taken along a line similar to the line II-II of FIG. 1, showing a first portion of a lower dielectric layer applied over the oxide layer and the second sacrificial layer, the first sacrificial layer has been removed.

With reference to FIG. 6, next, a first portion of the first dielectric layer 116 is formed above the substrate 108 on the oxide layer 112 and the sacrificial layer 210. Typically, a chemical vapor deposition process is used to form the lower dielectric layer 116; however, any method may be used to form the lower dielectric layer.

Figure 7:
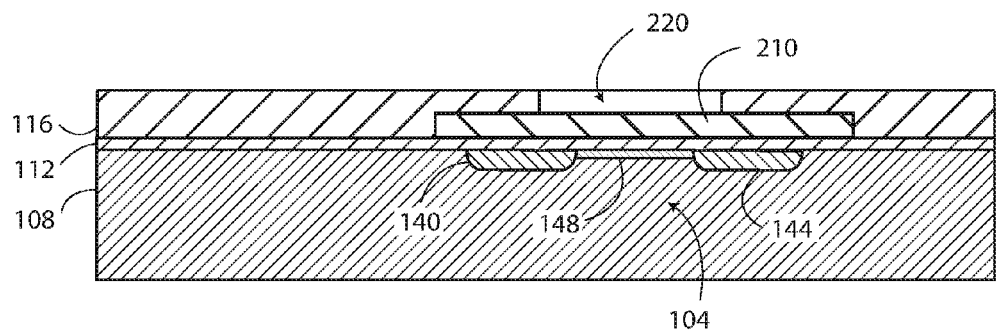
FIG. 7 is a side cross sectional view taken along a line similar to the line II-II of FIG. 1, showing an opening etched into the first portion of the lower dielectric layer.

Thereafter, as shown in FIG. 7, a portion of the first dielectric layer 116 is etched by a dry etch process to form an opening 220 configured to receive the gate electrode 152. Alternatively, a mask (not shown) is applied to the first dielectric layer 116, and the opening 220 is formed by trenching through the first dielectric layer 116 using the mask as a guide.

Figure 8:
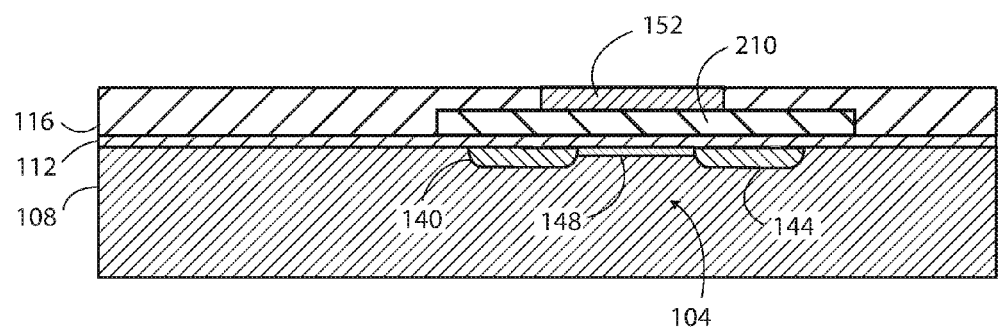
FIG. 8 is a side cross sectional view taken along a line similar to the line II-II of FIG. 1, showing material of a gate electrode deposited into the opening formed in the first portion of the lower dielectric layer.

Next, as shown in FIG. 8, the material of the gate electrode 152 is deposited into the opening 220, such that the gate electrode is formed above the oxide layer 112. Then, the gate electrode 152 and the first portion of the first dielectric layer 116 are smoothed using CMP, for example. In another embodiment, a barrier layer (not shown) is deposited beneath the gate electrode 152 in order to protect the gate electrode during removal of the sacrificial layer 210.

Figure 9:
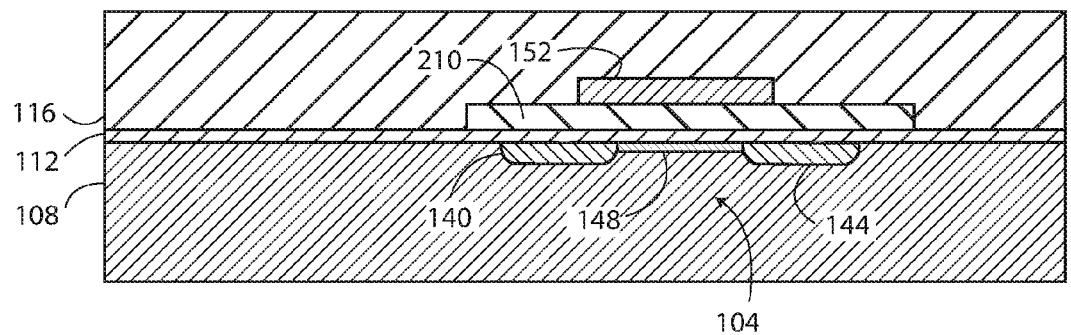
FIG. 9 is a side cross sectional view taken along a line similar to the line II-II of FIG. 1, showing a second portion of the lower dielectric layer.

As shown in FIG. 9, after forming the gate electrode 152, a second portion the lower dielectric layer 116 is deposited onto the first portion of the lower dielectric layer and the gate electrode 152.

Figure 10:
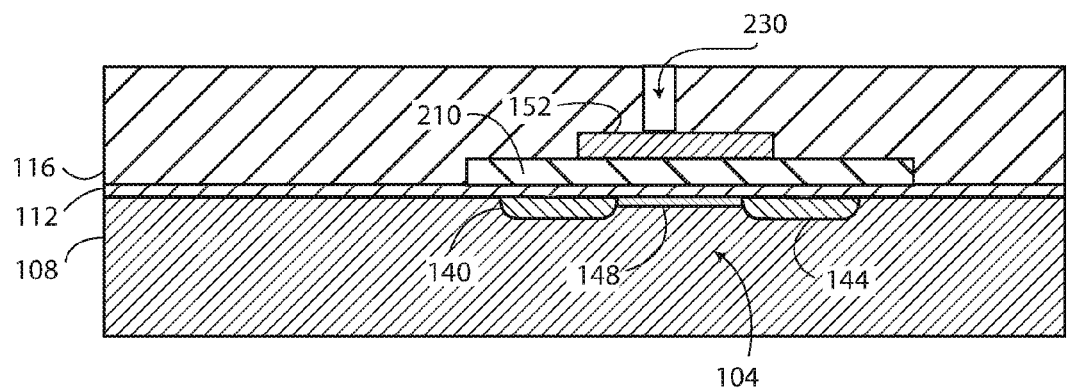
FIG. 10 is a side cross sectional view taken along a line similar to the line II-II of FIG. 1, showing an opening etched into the second portion of the lower dielectric layer.
Figure 11:
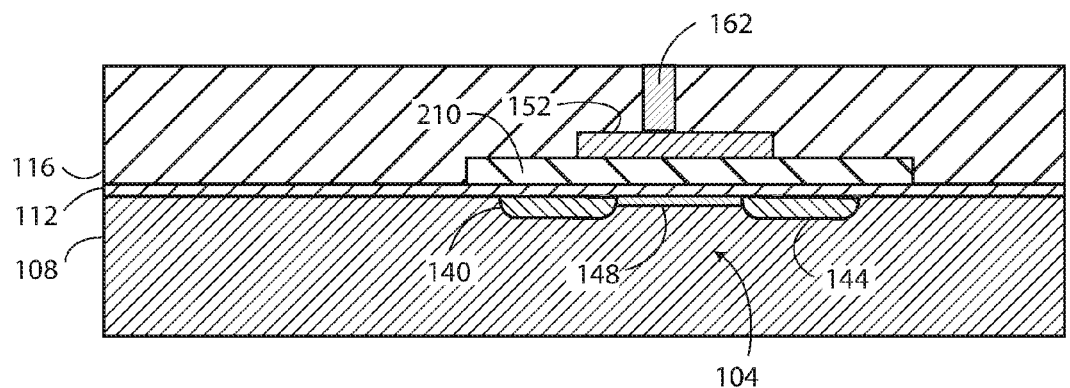
FIG. 11 is a side cross sectional view taken along a line similar to the line II-II of FIG. 1, showing material of a conducting path deposited into the opening formed in the second portion of the lower dielectric layer.

Next, with reference to FIGS. 10 and 11, the conducting path 162 is formed by etching an opening 230 into the lower dielectric layer 116. Typically, the lower dielectric layer 116 is etched with an anisotropic dielectric etch process, since the material of the gate electrode 152 is unaffected by the anisotropic dielectric etch process. Alternatively, a mask (not shown) is applied to the second portion of the first dielectric layer 116, and the opening 230 is formed by trenching through the first dielectric layer 116 using the mask as a guide.

After formation of the opening 230, the material of the conducting path 162 is deposited into the opening 230. The conducting path 162 is electrically connected to the gate electrode 152.

Figure 12:
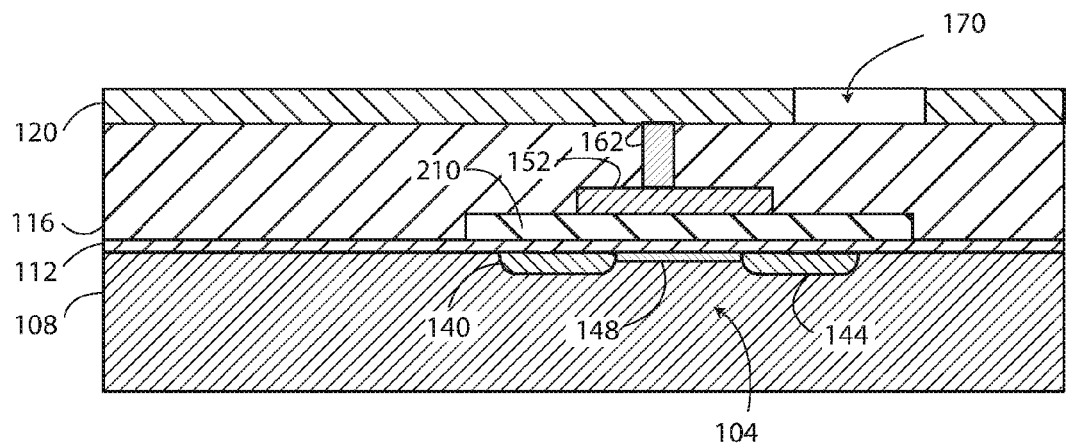
FIG. 12 is a side cross sectional view taken along a line similar to the line II-II of FIG. 1, showing a routing layer formed on the lower dielectric layer, an opening is formed in the routing layer.

Thereafter, as shown in FIG. 12, the routing layer 120 is deposited onto the lower dielectric layer 116 and the conducting path 162. Typically, a physical vapor deposition process is used to form the routing layer 120; however, any method may be used to form the routing layer. After the routing layer 120 is formed above the lower dielectric layer 116, the opening 170 is etched, using any desired process including trenching.

Figure 13:
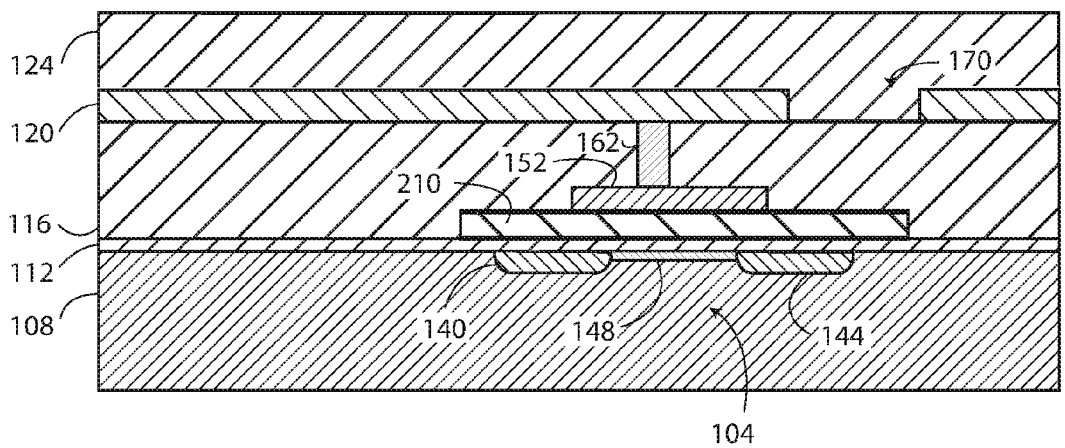
FIG. 13 is a side cross sectional view taken along a line similar to the line II-II of FIG. 1, showing an upper dielectric layer formed on the routing layer and in the opening formed in the routing layer, such that a portion of the upper dielectric layer contacts the lower dielectric layer.

Then, as shown in FIG. 13, the upper dielectric layer 124 is deposited on the routing layer 120 above the lower dielectric layer 116. Typically, a chemical vapor deposition process is used to form the upper dielectric layer 124; however, any method may be used to form the upper dielectric layer.

Figure 14:
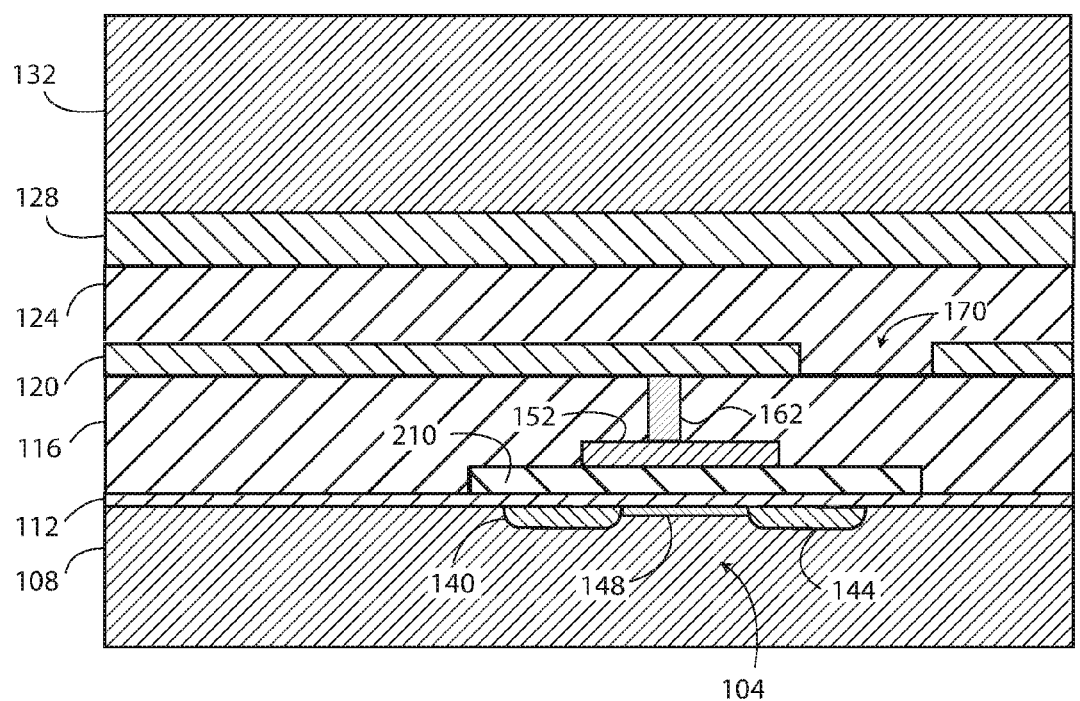
FIG. 14 is a side cross sectional view taken along a line similar to the line II-II of FIG. 1, showing a bond layer formed on the upper dielectric layer and a silicon layer located on the bond layer.

Next, as shown in FIG. 14, the bond layer 128 is deposited onto the upper dielectric layer 124 using a chemical vapor deposition process. Alternatively, any other method may be used to form the bond layer 128. The bond layer 128 is formed above the lower dielectric layer 116.

Subsequently, the silicon layer 132 is bonded to the bond layer 128. Bonding is done by any desired process including, but not limited to, anodic bonding, plasma activated bonding, eutectic bonding, thermo compression bonding, solid-liquid-interdiffusion bonding, and gluing.

With reference again to FIG. 2, next, a dry etching process is used to form the trench 158 through the layers 132, 128, 124, 120, and 116. Also, an etching process is used to remove the sacrificial layer 210. Removal of the sacrificial layer 210 forms the gap 156 and releases the proof mass 103 from the anchored portion 101. Suitable etching material for removing the sacrificial layer 210—if silicon-germanium is used as sacrificial material—includes chlorine trifluoride $ClF_3$, sulfur hexafluoride $SF_6$, and xenon difluoride $XeF_2$. This allows high etching selectivity against the silicon layer 132.

Next, the openings 190 are etched in the silicon layer 132, and the space 182 is etched in the bond layer 128. Etching of the space 182, the openings 190, and the trench 158 releases the proof mass 103 and enables movement of the proof mass 103 relative to the fixed portion 101. The etching process is typically done by trenching; however, any process may be used to release the proof mass 103. In another embodiment, the bond layer 128 is etched prior to the wafer-bonding process, shown in FIG. 14.

Next, the cap 136 is bonded to the silicon layer with the bonding member 198. The semiconductor device 100 is then electrically connectable to an external read out circuit (not shown) for operation.

In operation, the proof mass 103 moves relative to anchored portion 101 in response to a change in acceleration of the semiconductor device 100. Movement of the proof mass 103 results in movement of the gate electrode 152 relative to the channel region 148 and the doped regions 140, 144. When the gate electrode 152 moves relative to the channel region 148, the conducting path induced in the channel region is affected. Accordingly, the amount of current flow between the doped regions 140, 144 through the channel region 148 is dependent on the magnitude and the direction of the acceleration to which the semiconductor device 100 is exposed.

The semiconductor device 100 uses the moving-gate transduction principle to sense a measurand. Therefore, the semiconductor device 100 is configured to function with a simplified external read out circuit (not shown) since there is no capacitance-to-voltage conversion required, as is the case with devices that operate according to the capacitance transduction principle. Also, the semiconductor device 100 defines a smaller sensor core (i.e. the transducer 104) than sensors using the capacitive transduction principle. Accordingly, the semiconductor device 100 is particularly suitable for applications including, but not limited to, consumer electronics, such as mobile telephones and smart phones. Additionally, the robust composition of the semiconductor device 100 makes it useful in automotive applications, as well as in any application in which a very small, robust, and low cost sensor is desirable. Furthermore, the semiconductor device 100 may be implemented in or associated with a variety of applications such as home appliances, laptops, handheld or portable computers, wireless devices, tablets, personal data assistants (PDAs), MP3 players, camera, GPS receivers or navigation systems, electronic reading displays, projectors, cockpit controls, game consoles, earpieces, headsets, hearing aids, wearable display devices, and security systems.

As described above, portions of the layers 116, 120, 124, 128, and 132 are configured to move during operation of the semiconductor device 100. Accordingly, the movable portions of the layers 116, 120, 124, 128, and 132 are referred to herein as functional layers of the semiconductor device 100. Since the functional layers include layers of silicon, the functional layers exhibit a low stress gradient, low temperature influence, high mechanical stability, and high reliability.

Figure 15:
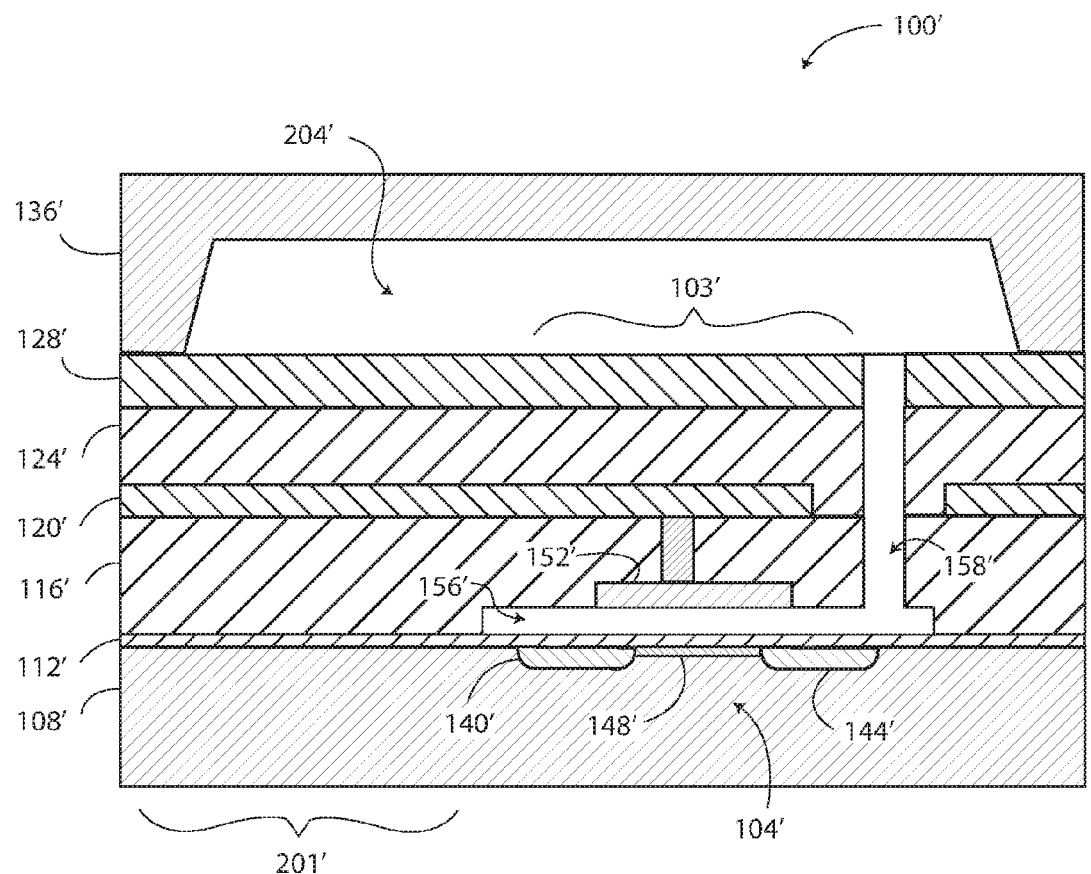
FIG. 15 is a side cross sectional view taken along a line similar to the line II-II of FIG. 1, of another embodiment of a MEMS semiconductor device, as described herein, that includes a cap configured to encapsulate a transducer portion of the MEMS semiconductor device.

As shown in FIG. 15, another embodiment of a MEMS semiconductor device 100' is substantially identical to the semiconductor device 100, except that the semiconductor device 100' does not include the silicon layer 132 bonded to the bond layer 128. Instead, the semiconductor device 100' includes a substrate 108', an oxide layer 112', a lower dielectric layer 116', a routing layer 120', an upper dielectric layer 124', a bond layer 128', and a silicon cap 136' bonded to the bond layer. A trench 158' extends through the bond layer 128', the upper dielectric layer 124', the routing layer 120', and the lower dielectric layer 116' and is configured to fluidly connect a gap 156' to a cap cavity 204'.

The semiconductor device 100' further includes a moving-gate transducer 104' that includes a source region 140', a drain region 144', a channel region 148', and a gate electrode 152'. Accordingly, the moving-gate transducer 104' is at least partially formed in the substrate 108' and at least partially formed in lower dielectric layer 116' (a first dielectric layer).

The semiconductor device 100' defines a fixed portion 201' and proof mass 103'. The fixed portion 201' is anchored to the substrate 108'. The proof mass 103' is movable relative to the fixed portion 206' and includes portions of the lower dielectric layer 116', the routing layer 120', the upper dielectric layer 124', and the bonding layer 128'. The silicon cap 136' is connected to the fixed portion 201'.

In one embodiment, during fabrication of the semiconductor device 100', the silicon cap 136' is bonded to the bonding layer 128' and is configured to seal a fluid within the cap cavity 204', the trench 158', and the gap 156'. The fluid may be provided as air or any desired gas or gasses. Furthermore, the seal provided by the silicon cap 136' enables the fluid to be maintained at or near a predetermined pressure.

Figure 16:
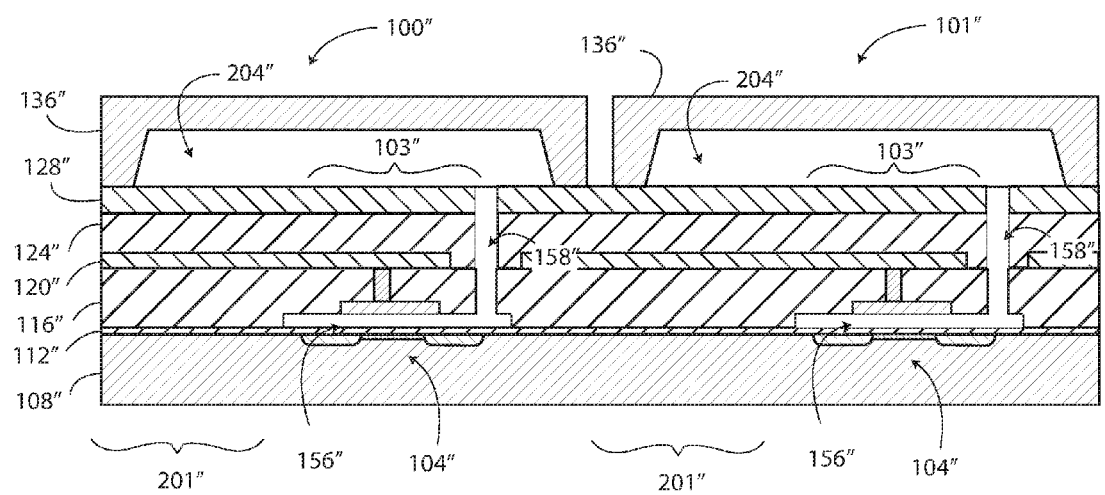
FIG. 16 is a side cross sectional view taken along a line similar to the line II-II of FIG. 1, of another embodiment of a MEMS semiconductor device, as described herein, that includes two sensor devices formed on a single substrate and each sensor device is encapsulated by a respective cap.

As shown in FIG. 16, a left semiconductor device 100" and a right semiconductor device 101" are formed on a substrate 108". Each semiconductor device 100", 101" is substantially identical to the semiconductor device 100' and includes a moving-gate transducer 104". The semiconductor devices 100", 101" each include an oxide layer 112", a lower dielectric layer 116", a routing layer 120", an upper dielectric layer 124", a bonding layer 128", and a respective silicon cap 136". Furthermore, each semiconductor device 100", 101" includes a fixed portion 201" and a proof mass 103". The fixed portion 201" is anchored to the substrate 108". The proof mass 103" is movable relative to the fixed portion 206" and includes portions of the lower dielectric layer 116", the routing layer 120", the upper dielectric layer 124", and the bonding layer 128". The silicon cap 136" is connected to the fixed portion 206".

A trench 158" extends through the bond layer 128", the upper dielectric layer 124", the routing layer 120", and the lower dielectric layer 116" and is configured to fluidly connect a gap 156" to a cap cavity 204" for each of the semiconductor devices 100", 101". For each semiconductor device 100", 101", the gap 156", the cap cavity 204", and the trench 158" are referred to herein as the spaces 156", 158", 204" of the semiconductor device.

A different "environment" may be formed within the spaces 156", 158", 204" of the left semiconductor device 100" as compared to the environment of the spaces of the right semiconductor device 101". In particular, the spaces 156", 158", 204" of the left semiconductor device 100" may include a first fluid at a first pressure, whereas the spaces 156", 158", 204" of the right semiconductor device 101" may include a second fluid at a second pressure. The first fluid may differ from the second fluid and the first pressure may differ from the second pressure. In this way, two "environments" are formed on a single chip (i.e. the substrate).

Having two environments on a single chip is useful when, for example, the first semiconductor device 100" is operated as an accelerometer at a first residual pressure of the fluid therein, and the second semiconductor device 101" is operated as a gyroscope at a second residual pressure of the fluid therein. Accordingly, both of the semiconductor devices 100", 101" are operated at an ideal pressure regime on a single chip.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A method of fabricating a semiconductor device, comprising:
   forming a dielectric layer above a substrate, the dielectric layer including a fixed dielectric portion and a proof mass portion;
   forming a source region and a drain region in the substrate;
   forming a gate electrode in the proof mass portion; and
   releasing the proof mass portion, such that the proof mass portion is movable with respect to the fixed dielectric portion and the gate electrode is movable with the proof mass portion relative to the source region and the drain region,
   wherein the dielectric layer is supported by the substrate.

2. The method of claim 1 further comprising:
   forming an oxide layer above the substrate; and
   forming the gate electrode above the oxide layer.

3. The method of claim 1, wherein the dielectric layer is a first dielectric layer, the method further comprising:
   forming a routing layer above the first dielectric layer;
   forming a second dielectric layer above the routing layer; and
   forming a bond layer on the second dielectric layer, a portion of the bond layer supported by the proof mass portion.

4. The method of claim 1 further comprising:
   forming a sacrificial layer above the substrate;
   forming the proof mass portion over the sacrificial layer; and
   removing the sacrificial layer during the releasing of the proof mass portion.

5. The method of claim 4, wherein removing the sacrificial layer forms a gap between the proof mass portion and the substrate.

6. The method of claim 5 further comprising:
   attaching a cap above the dielectric layer to seal a fluid in the gap.

7. The method of claim 6, wherein the cap is formed from silicon.

8. A semiconductor device comprising:
   a source region and a drain region defined in a substrate;
   a dielectric layer supported by the substrate, the dielectric layer including a fixed dielectric portion and a proof mass portion; and
   a gate electrode defined in the proof mass portion, the gate electrode movable with the proof mass portion relative to the source region and the drain region.

9. The semiconductor device of claim 8 further comprising:
   an oxide layer located between the substrate and the dielectric layer,
   wherein a gap is defined between the proof mass portion and the oxide layer.

10. The semiconductor device of claim 9, wherein the dielectric layer is a first dielectric layer, the semiconductor device further comprising:
    a routing layer located above the first dielectric layer;
    a portion of a bond layer supported by the proof mass portion;
    a second dielectric layer located above the routing layer and under the bond layer; and
    a cap attached to the bond layer and defining a cap cavity fluidly coupled to the gap.

11. The semiconductor device of claim 10, wherein a fluid is sealed in the cap cavity and the gap.

12. The semiconductor device of claim 11, wherein the cap is formed from silicon.

13. The semiconductor device of claim 10 further comprising:
    a trench extending through the bond layer, the first dielectric layer, the routing layer, and the second dielectric layer, and the trench extending between the cap cavity and the gap.

14. A semiconductor device comprising:
    a substrate;
    a dielectric layer located above the substrate;
    a proof mass including a first portion of the dielectric layer, the proof mass movable within a proof mass space; and
    a moving-gate transducer at least partially formed within the substrate and at least partially formed within the proof mass.

15. The semiconductor device of claim 14, further comprising:
    a bond layer located above the dielectric layer; and
    a cap attached to the bond layer and defining a cap cavity fluidly coupled to the proof mass space.

16. The semiconductor device of claim 15, wherein a fluid is sealed in the cap cavity and the proof mass space.

17. The semiconductor device of claim 15, wherein the dielectric layer is a first dielectric layer, the semiconductor device further comprising:
    an oxide layer located between the substrate and the first dielectric layer;
    a routing layer located above the first dielectric layer and below the bond layer; and
    a second dielectric layer located above the routing layer and below the bond layer,
    wherein the proof mass includes a first portion of the routing layer and a first portion of the second dielectric layer.

18. The semiconductor device of claim 17 wherein:
    a first gap is defined between the proof mass and the oxide layer, and
    the cap cavity is fluidly coupled to the gap through a trench.

19. The semiconductor device of claim 14, wherein the moving-gate transducer includes a source region formed in the substrate, a drain region formed in the substrate, and a gate electrode formed in the proof mass.

* * * * *